(12) United States Patent
Harris et al.

(10) Patent No.: US 6,748,089 B1
(45) Date of Patent: Jun. 8, 2004

(54) SWITCH RESPONSIVE TO AN AUDIO CUE

(75) Inventors: Richard W. Harris, 2082 Mountain Vista La., Provo, UT (US) 84606; Keith L. Davis, Salt Lake City, UT (US)

(73) Assignees: Sonic Innovations, Inc., Salt Lake City, UT (US); Richard W. Harris, Provo, UT (US)

( * ) Notice: Subject to any disclaimer, the term of this patent is extended or adjusted under 35 U.S.C. 154(b) by 577 days.

(21) Appl. No.: 09/691,765

(22) Filed: Oct. 17, 2000

(51) Int. Cl.[7] ............................................. H03G 3/00
(52) U.S. Cl. ........................ 381/107; 381/104; 381/312
(58) Field of Search ................................. 381/107, 104, 381/109, 57, 317, 312, 318, 320, 321

(56) References Cited

U.S. PATENT DOCUMENTS

| | | | |
|---|---|---|---|
| 3,571,529 A | 3/1971 | Gharib | 179/107 |
| 4,475,230 A | 10/1984 | Fukuyama et al. | 381/68 |
| 4,490,585 A | 12/1984 | Tanaka | 179/107 |
| 4,491,980 A | 1/1985 | Ichikawa | 455/344 |
| 4,508,940 A | 4/1985 | Steeger | 179/107 |
| 4,548,082 A | 10/1985 | Engebretson et al. | 73/585 |
| 4,589,137 A | 5/1986 | Miller | 381/94 |
| 4,630,302 A | 12/1986 | Kryter | 381/57 |
| 4,679,240 A | 7/1987 | Heide | 381/68.6 |
| 4,689,820 A | 8/1987 | Köpke et al. | 381/68 |
| 4,696,032 A | 9/1987 | Levy | 379/390 |
| 4,731,850 A | 3/1988 | Levitt et al. | 381/68.2 |
| 4,773,088 A | 9/1988 | Matheny | 379/395 |
| 4,792,977 A | 12/1988 | Anderson et al. | 381/68.4 |
| 4,802,227 A | 1/1989 | Elko et al. | 381/92 |
| 4,845,755 A | 7/1989 | Busch et al. | 381/68 |
| 4,887,299 A | 12/1989 | Cummins et al. | 381/68.4 |
| 4,920,570 A | 4/1990 | West et al. | 381/68 |
| 4,953,216 A | 8/1990 | Beer | 381/68.4 |
| 4,996,712 A | 2/1991 | Laurence et al. | 381/68.4 |
| 5,012,520 A | 4/1991 | Steeger | 381/68 |
| 5,027,410 A | 6/1991 | Williamson et al. | 381/68.4 |
| 5,097,510 A | 3/1992 | Graupe | 381/47 |
| 5,201,006 A | 4/1993 | Weinrich | 381/68 |
| 5,202,927 A | 4/1993 | Tøpholm | 381/68 |
| 5,355,418 A | 10/1994 | Kelsey et al. | 381/72 |

(List continued on next page.)

*Primary Examiner*—Melur Ramakrishnaiah
(74) *Attorney, Agent, or Firm*—Thelen Reid & Priest LLP; David B. Ritchie (57) ABSTRACT

The present invention provides a switch method and apparatus that is switchable among a plurality of operational modes by attenuating an input audio signal detected by the apparatus. The apparatus includes a microphone which converts the input audio signal to an input electrical signal (IES), a first memory which stores a threshold value, a second memory which stores at least one parameter set, a selector which is responsive to the first memory and to the IES for selecting a first parameter set as an enabled parameter set, and a signal conditioner coupled to the IES, the signal conditioner being responsive to the IES and to an enabled parameter set for producing a conditioned electrical signal (CES). An alternative switch method and apparatus switchable among a plurality of operational modes by attenuating an input audio signal detected by the apparatus includes a microphone which converts the input audio signal to an IES, a signal envelope detector (SED) coupled to the IES, the SED having a first time constant, wherein the SED produces a SED output in response to the IES, a noise envelope detector (NED) coupled to the IES, the NED having a second time constant that is greater than the first time constant, the NED produces a NED output in response to the IES, a first memory which stores at least one parameter set, a selector which is responsive to the SED output and to the NED output for selecting a first parameter set as an enabled parameter set, and a signal conditioner coupled to the IES, the signal conditioner being responsive to the IES and to an enabled parameter set for producing a CES.

88 Claims, 9 Drawing Sheets

U.S. PATENT DOCUMENTS

| | | |
|---|---|---|
| 5,384,852 A | 1/1995 | Schären .................... 381/68 |
| 5,524,056 A | 6/1996 | Killion et al. ............. 381/68.2 |
| 5,551,953 A | 9/1996 | Lattin et al. ................. 604/20 |
| 5,553,152 A | 9/1996 | Newton ................... 381/68.6 |
| 5,588,064 A | 12/1996 | McSwiggen et al. ...... 381/69.2 |
| 5,636,285 A | 6/1997 | Sauer ...................... 381/68.2 |
| 5,659,621 A | 8/1997 | Newton ...................... 381/68 |
| 5,687,242 A | 11/1997 | Iburg ........................ 381/69.2 |
| 5,717,771 A | 2/1998 | Sauer et al. ............... 381/68.6 |
| 5,721,783 A | 2/1998 | Anderson ................. 381/68.6 |
| 5,825,898 A | 10/1998 | Marash ....................... 381/92 |
| 5,909,497 A | 6/1999 | Alxandrescu .............. 381/312 |
| 5,910,997 A | 6/1999 | Ishige et al. ............... 381/314 |
| 6,035,050 A | 3/2000 | Weinfurtner et al. ....... 381/313 |
| 6,044,164 A | 3/2000 | Ach-Kowalewski ........ 381/314 |

SWITCH RESPONSIVE TO AN AUDIO CUE

BACKGROUND OF THE INVENTION

1. Field of the Invention

The present invention generally relates to switches. More particular, the present invention relates to switches that can be operated without physically contacting the switch but rather by attenuating the audio input signal of a microphone. Even more particularly, the present invention relates to an acoustic switch apparatus incorporated into a hearing aid and activated by attenuating the audio input signal that allows the user to control the selection of parameter sets within the hearing aid.

2. The Background Art

In any given day, one may expect to be exposed to a wide variety of radically different sound environments. Therefore, it would be desirable to have a hearing aid which is capable of adequately responding to these diverse sound environments by allowing the user the choice of selecting from among a plurality of parameter sets (e.g., volume control, frequency response functions, mute, etc.) to optimize performance. A user wearing such a device would be able to select the most suitable parameter set to fit individual comfort needs to accommodate a particular sound environment that the user may encounter.

The ability to construct a miniaturized hearing aid with the capability of switching to a plurality of parameter sets has existed for some time. Unfortunately, by solving the problem of placing a large variety of features into a miniaturized hearing aid, a new problem has arisen. That is, where can the manufacturer place the switches needed to control these new features. By miniaturizing the device to approximately the size of a conventional pea, the physical limitations of where to place a switch have become a serious concern. This problem of where to place the mechanical component of the switch that controls a miniaturized hearing aid is even more aggravated when the device is worn deep within the user's ear canal.

For custom hearing aids, the typical solution has been to provide an electro-mechanical switch on the faceplate, such as a push button or a toggle switch. These electro-mechanical switches physically consume faceplate area and volume behind the faceplate. For very small devices that are to be worn deep within the ear canal, it is often impossible to provide a switch because there is simply no space available on the faceplate.

Wireless remote control systems offer the advantage of eliminating the need for any additional switch component on the faceplate. However, remote control actuator hearing aid systems carry with them a number of inherent undesirable features. Remote actuators often have complicated control systems that can make them difficult to operate by the average hearing aid user. This problem may be further aggravated by the user having limited manual dexterity due to some debilitating illness, such as arthritis. Furthermore, by their very nature, these remote control devices require at least two separate standalone components (i.e., the hearing aid component and the remote control component). Therefore, the user of a remote control hearing aid will be burdened by carrying the remote actuator at all times, if the user desires to control the switching operations of the remote controlled hearing aid.

Capacitive-contact switches have been used as switching devices because these components require a minimum area on the faceplate. However, these devices do require some faceplate area. Furthermore, these devices require the user to physically touch the switch in order to control the switch, which may become burdensome when the user's dexterity is limited by some debilitating illness, such as arthritis.

Another approach to solving this problem has been to install switches as integrated components within the battery door assemblies. These devices are advantageous in that there is no need for a switch on the faceplate. However, these devices suffer a number of limitations in that they are generally constructed as larger units and are often more expensive.

Therefore, there is a need for a switch apparatus that can be controlled by a user without a need to physically touch the switch apparatus.

BRIEF DESCRIPTION OF THE INVENTION

The present invention provides a switch method and apparatus that is switchable among a plurality of operational modes by attenuating an input audio signal detected by the apparatus. The apparatus includes a microphone which converts the input audio signal to an input electrical signal (IES), a first memory which stores a threshold value, a second memory which stores at least one parameter set, a selector which is responsive to the first memory and to the IES for selecting a first parameter set as an enabled parameter set, and a signal conditioner coupled to the IES, the signal conditioner being responsive to the IES and to an enabled parameter set for producing a conditioned electrical signal (CES). An alternative switch method and apparatus switchable among a plurality of operational modes by attenuating an input audio signal detected by the apparatus includes a microphone which converts the input audio signal to an IES, a signal envelope detector (SED) coupled to the IES, the SED having a first time constant, wherein the SED produces a SED output in response to the IES, a noise envelope detector (NED) coupled to the IES, the NED having a second time constant that is greater than the first time constant, the NED produces a NED output in response to the IES, a first memory which stores at least one parameter set, a selector which is responsive to the SED output and to the NED output for selecting a first parameter set as an enabled parameter set, and a signal conditioner coupled to the IES, the signal conditioner being responsive to the IES and to an enabled parameter set for producing a CES.

BRIEF DESCRIPTION OF THE DRAWINGS

The accompanying drawings, which are incorporated in and constitute a part of this Specification, illustrate one or more embodiments of the invention and, together with the present description, serve to explain the principles of the invention.

DETAILED DESCRIPTION

The present invention is described herein in the aspect using it as a switching mechanism in a hearing aid. Those of ordinary skill in the art will realize that the following description of the present invention is illustrative only and not in any way limiting. Other embodiments of the invention will readily suggest themselves to such skilled persons having the benefit of this disclosure. Reference will now be made in detail to an implementation of the present invention as illustrated in the accompanying drawings. The same reference numbers will be used throughout the drawings and the following description to refer to the same or like parts.

Figure 1:
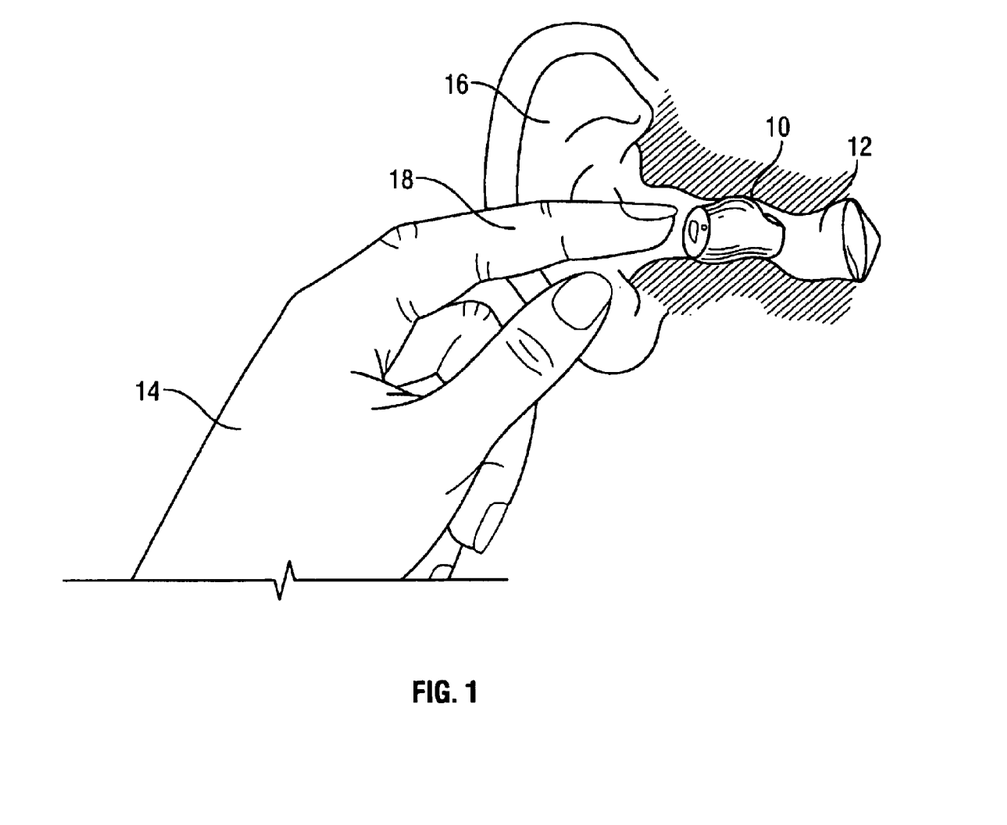
FIG. 1 is a partial sectional view showing a completely in the canal (CIC) hearing aid system in place in a user's ear canal.

Referring to FIG. 1, a specific embodiment of the present invention is depicted as an acoustic switch apparatus as a component of a hearing aid 10 that is shown mounted within an ear canal 12. A user hand 14 can be placed near the ear pinna 16 and a finger 18 can be used to block or partially abstract the ear canal 12, resulting in attenuation of the input audio signal from the surrounding sound environment which reaches hearing aid 10. Hearing aid 10 is depicted as a "completely in the canal" (CIC) type. As described below the hearing aid 10 is switchable among a plurality of operational modes. This hearing aid aspect of this invention may also be embodied in other conventional configurations of hearing aids such as "in the ear", "in the canal", "behind the ear", the eyeglass type, body worn aids and surgically implanted hearing aids. Due to the extreme miniaturization of CIC hearing aids, the features of this acoustic switch invention are particularly advantageous in this type of hearing aid because of the difficulty in placing a mechanical switch on the face of a miniaturized hearing aid 10 as well as in the physical difficulties associated with reaching deep into the ear canal 12 to control the switching functions of the hearing aid 10 in the CIC embodiment.

Figure 2:
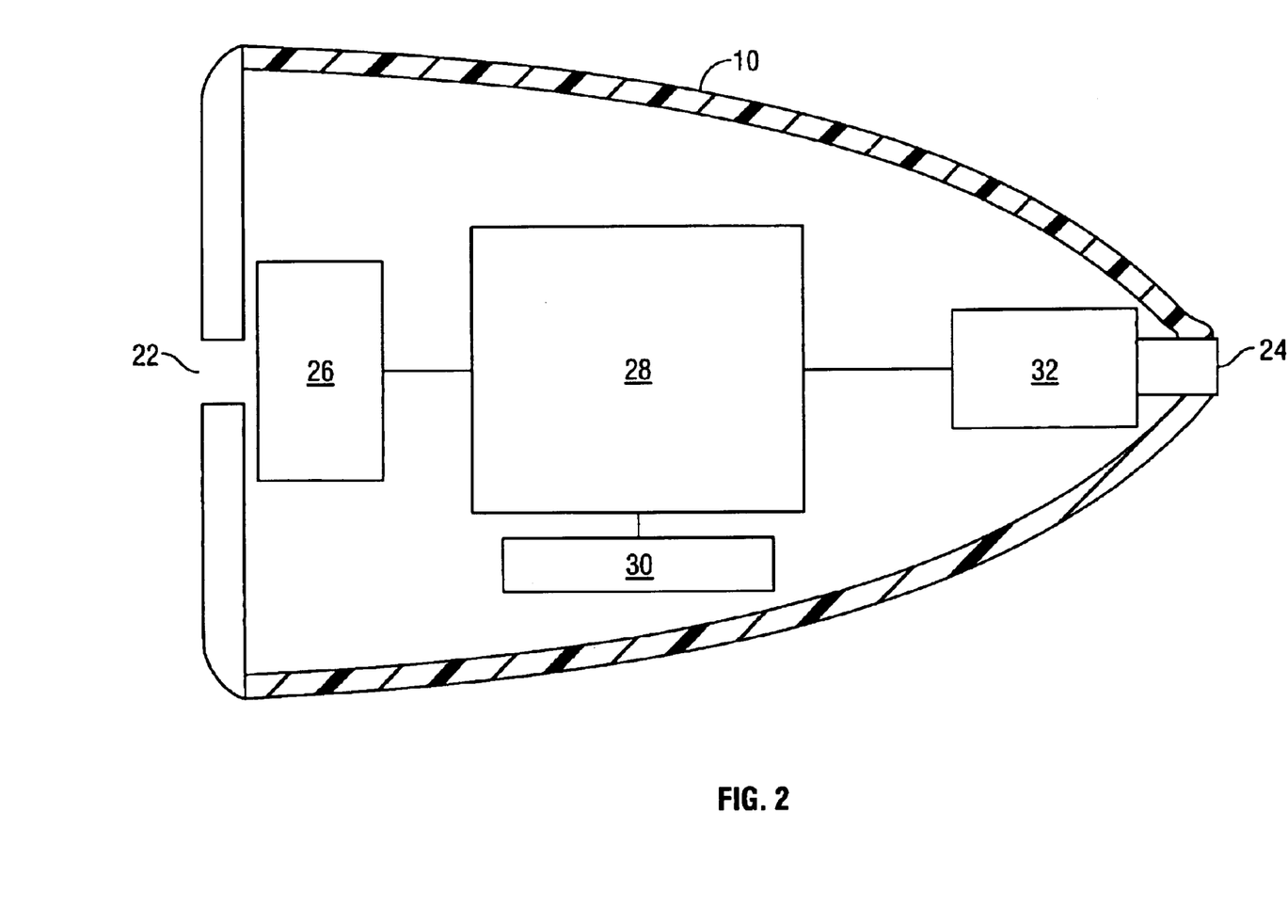
FIG. 2 is a system block diagram of a CIC hearing aid incorporating an acoustically activated switch in accordance with a specific embodiment of the present invention.

FIG. 2 depicts a system block diagram of the CIC hearing aid 10. The hearing aid 10 includes a housing 20 having a face with an audio input port 22 and a rear end with an exit port 24, a microphone 26 located near the audio input port 22, hearing aid circuitry 28, a battery 30, and an output transducer 32.

Figure 3A:
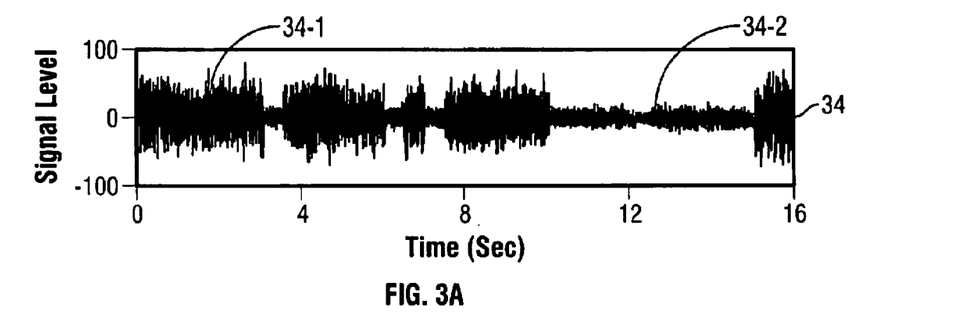
FIGS. 3A, 3B and 3C are, respectively, plots of signal vs. time, envelope level signal vs. time and comparator output vs. time for an acoustically activated switch in accordance with a specific embodiment of the present invention.

FIG. 3A depicts a microphone input electrical signal (IES) 34 as a function of time in response an input audio signal that is periodically attenuated by placing a finger 18 directly covering the audio input port 22 of a hearing aid 10. Attenuating the input audio signal can be achieved in any number of ways, such as "cupping" a hand 14 near the vicinity of the audio input port 22 of the hearing aid 10 or placing a finger over the canal as shown in FIG. 1. When the input audio signal is not attenuated, the IES 34 can be seen to be relatively large as illustrated in the non-attenuated IES 34-1, as compared to when the audio input signal is attenuated, as illustrated by IES 34-2.

Figure 3B:
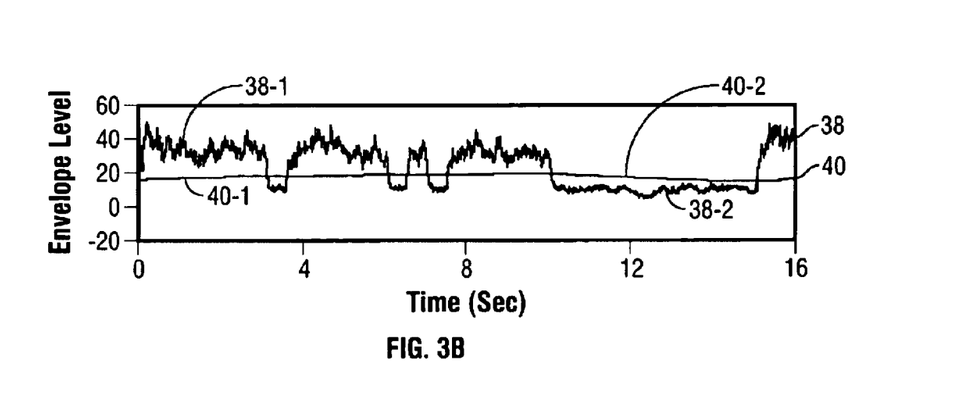

FIG. 3B depicts the IES 34 transformed by a signal envelope detector (SED) 102 (See FIG. 8) and a noise envelope detector (NED) 104 (See FIG. 8) into a SED signal 38 and a NED signal 40, respectively. Briefly, the envelope detector transforms the IES 34 by measuring the mean level of the absolute value of the IES received on the input line from the microphone 26 and this measurement is dependent upon a particular time constant for the particular envelope detector. In this invention the SED time constant is intended to be faster than the NED time constant. As a consequence, the IES 34 is sampled for a shorter period of time by the SED 102 to generate the SED signal 38 as compared to a longer measurement time period to sample the IES 34 by the NED 104. In a presently preferred embodiment, the ratio of the SED time constant to the NED time constant should differ by at least a factor of ten. As illustrated in FIG. 3B, when the audio signal input is unencumbered, i.e., not attenuated, the SED signal 38-1 is found to be greater than the NED signal 40-1. Whereas, when the audio signal is attenuated, IES 34-2 becomes smaller and the SED signal 38-2 is found to be smaller than the NED signal 40-2.

Figure 3C:
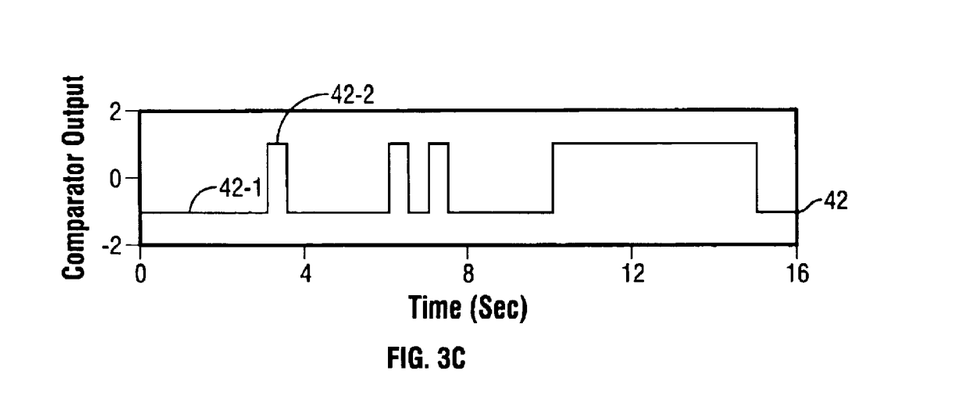

FIG. 3C depicts a comparator output 44. The selector 56 (See FIG. 8) may have a comparator for comparing the magnitude of the SED signal 38 with the NED signal 40 and can be designed to produce a digital integer comparator output 42 that can be used as a communication signal which can control an attached device by signaling switch commands via the digital integer comparator output 42. Here a "high" value 42-2 corresponds to an attenuation and a "low" value 42-1 corresponds to "normal" operation.

Figure 4:
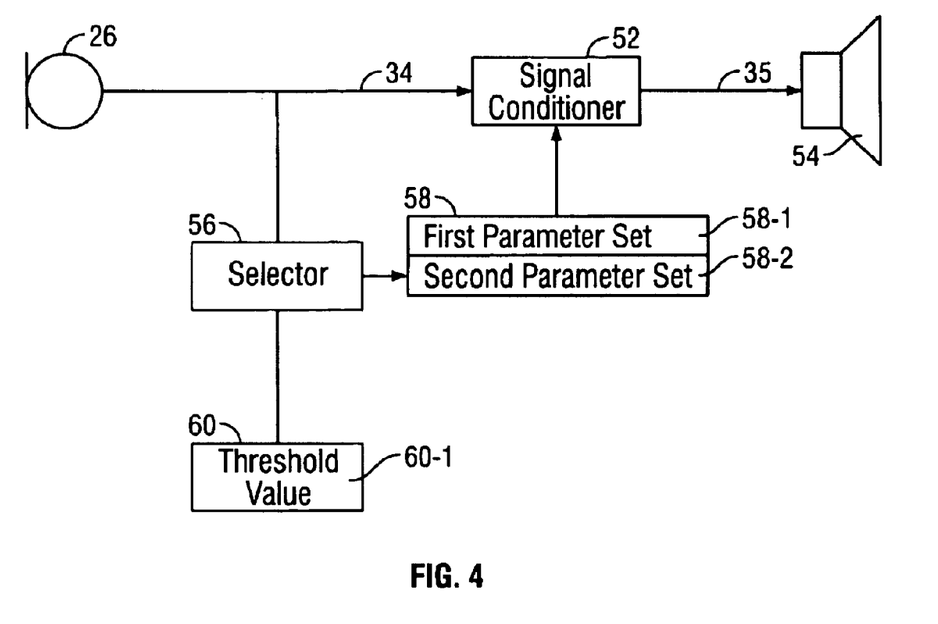
FIG. 4 is a system block diagram of a hearing aid incorporating an acoustically activated switch in accordance with a specific embodiment of the present invention.

FIG. 4 depicts a block diagram of a first specific embodiment of the present invention. In this embodiment a microphone 26 receives an audio or acoustic signal and produces an IES 34. The IES 34 is connected to a signal conditioner 52 and to a selector 56. The signal conditioner 52 is responsive to an enabled parameter set (58-1 or 58-2 parameter set memory 58) and to the IES 34 for transmitting a conditioned electrical signal (CES) 35 to output transducer 54. Processing performed by the signal conditioner 52 typically includes such functions as amplification, filtering (or differential amplification), and limiting. Output transducer 54 produces an audio output in response to the CES signal. The selector 56 selects an enabled parameter set from among a plurality of parameter sets stored in parameter set memory 58 in response to IES 34 and a threshold value 60-1 stored in threshold memory 60. A default parameter set may be initially pre-selected. When selector 56 determines that IES 34 has dropped to a value less than that of the threshold value 60-1 stored in threshold memory 60, selector 56 selects a new parameter set stored in parameter set memory 58 to be the enabled parameter set. The selection mechanism may proceed in any number of different ways. One way of having the selector 56 select from among the parameter sets stored in parameter set memory 58 is to use a circular queue with a wrap around memory 58 wherein the selector 56 selects the next-in-line sequential parameter set in the circular queue of memory 58 by stepping through the entries in the queue and selecting the next-in-line parameter set to be the enabled parameter set. Since the IES 34 is proportional to the input audio signal, the user can operate the switching operation of the selector 56 by attenuating the input audio signal, for example, by placing a finger 18 in the entrance of the ear canal 12. Once the IES 34 drops below the threshold level 60-1 stored in the threshold memory 60, then the selector 56 selects a different parameter set as the enabled parameter set in the hearing aid, e.g., parameter set 58-2. In this way the user can control the hearing aid functions, such as volume control, mute, filtering, and other limiting functions, without the need for an electro-mechanical switch.

Figure 5:
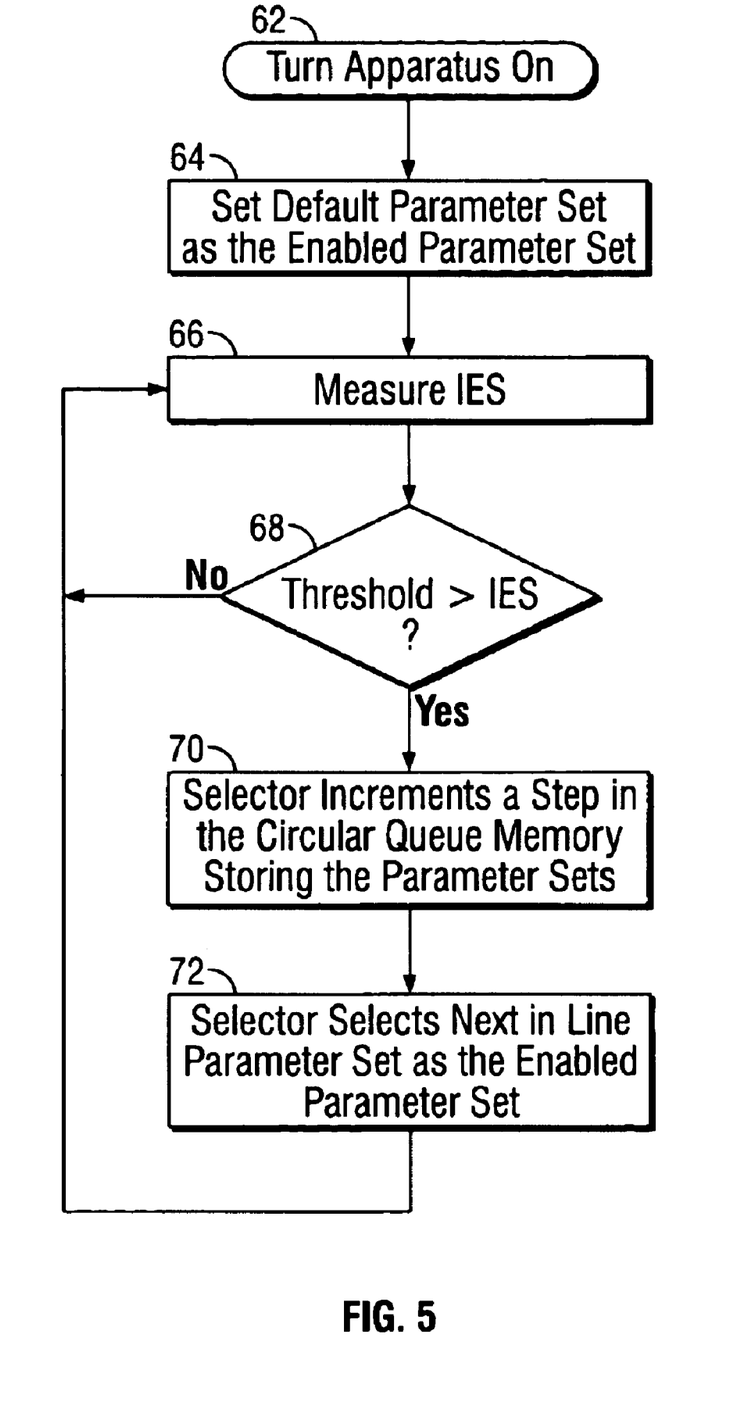
FIG. 5 is a flow diagram of a method of operation of an acoustically activated switch in accordance with the apparatus of FIG. 4.

FIG. 5 is a flow diagram of a method of operation of the hearing aid shown in FIG. 3. After the hearing aid 10 is turned on at block 62, the selector 56 sets a default parameter set as the enabled parameter set. During the operation of the hearing aid the selector 56 continually measures the IES 34 at block 66. After each measurement, the selector 56 compares the IES 34 against the threshold value 60-1 stored in threshold memory 60 at block 68. If the IES 34 is greater than the threshold value 60-1 stored in threshold memory 60, then the selector 56 returns to measuring the IES 34 at block 66. If the IES 34 is less than or equal to the threshold value 60-1 stored in threshold memory 60 then the selector 56 proceeds to block 70 by stepping through the circular queue memory 58 holding the first and second parameter sets 58-1 and 58-2. The selector 56 then selects the next sequential parameter set as the enabled parameter set at block 72. After completion of the operation at block 72, the selector returns to measuring the intensity of the IES 34 at block 66. Any number of parameter sets may be stored in parameter set memory 58. Note also that the above mechanism can be used to select between a default parameter set and an alternate parameter set where the default parameter set is held in a first memory and the alternate parameter set (or sets) is held in a second memory.

Figure 6:
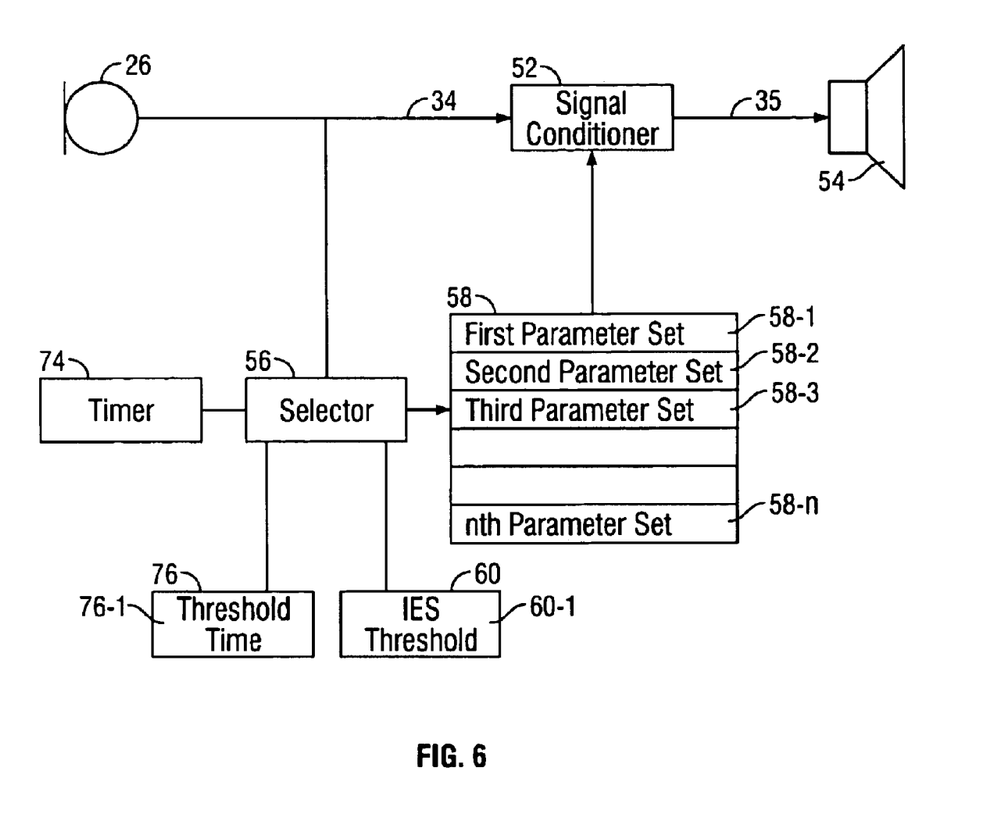
FIG. 6 is a system block diagram of a hearing aid incorporating an acoustically activated switch in accordance with another specific embodiment of the present invention.

FIG. 6 is a system block diagram of another specific embodiment of the present invention implemented in the context of a hearing aid 10. In accordance with this embodiment of the hearing aid 10, selector 56 selects an enabled parameter set when the IES 34 drops below a threshold value 60-1 stored in the first memory 60 for a time period greater than a first time setting 74-1 stored in a timing threshold memory 74. The microphone 26 converts an input audio signal into an IES 34 and transmits the IES 34 to a signal conditioner 52. The signal conditioner 52 is responsive to an enabled parameter set found in a parameter set memory 58 and to the IES 34 for producing and transmitting a CES signal 35 to the output transducer 54. The output transducer 54 produces an audio output in response to the CES signal 35. The selector 56 selects as an enabled parameter set a parameter set from among a plurality of said parameter sets stored in parameter set memory 58. The selector 56 is responsive to IES 34, an IES threshold value 60-1 stored in threshold memory 60 and to a first time setting 74-1 stored in timing threshold memory 74. When selector 56 determines that the IES 34 is less than the threshold value 60-1 for a time greater than the first time setting 74-1, the selector 56 selects another parameter set from among those stored in parameter set memory 58 to be the enabled parameter set. As before, the parameter sets may be stored in one or more locations, there may be a default parameter set and any number of parameter sets may be provided.

Figure 7:
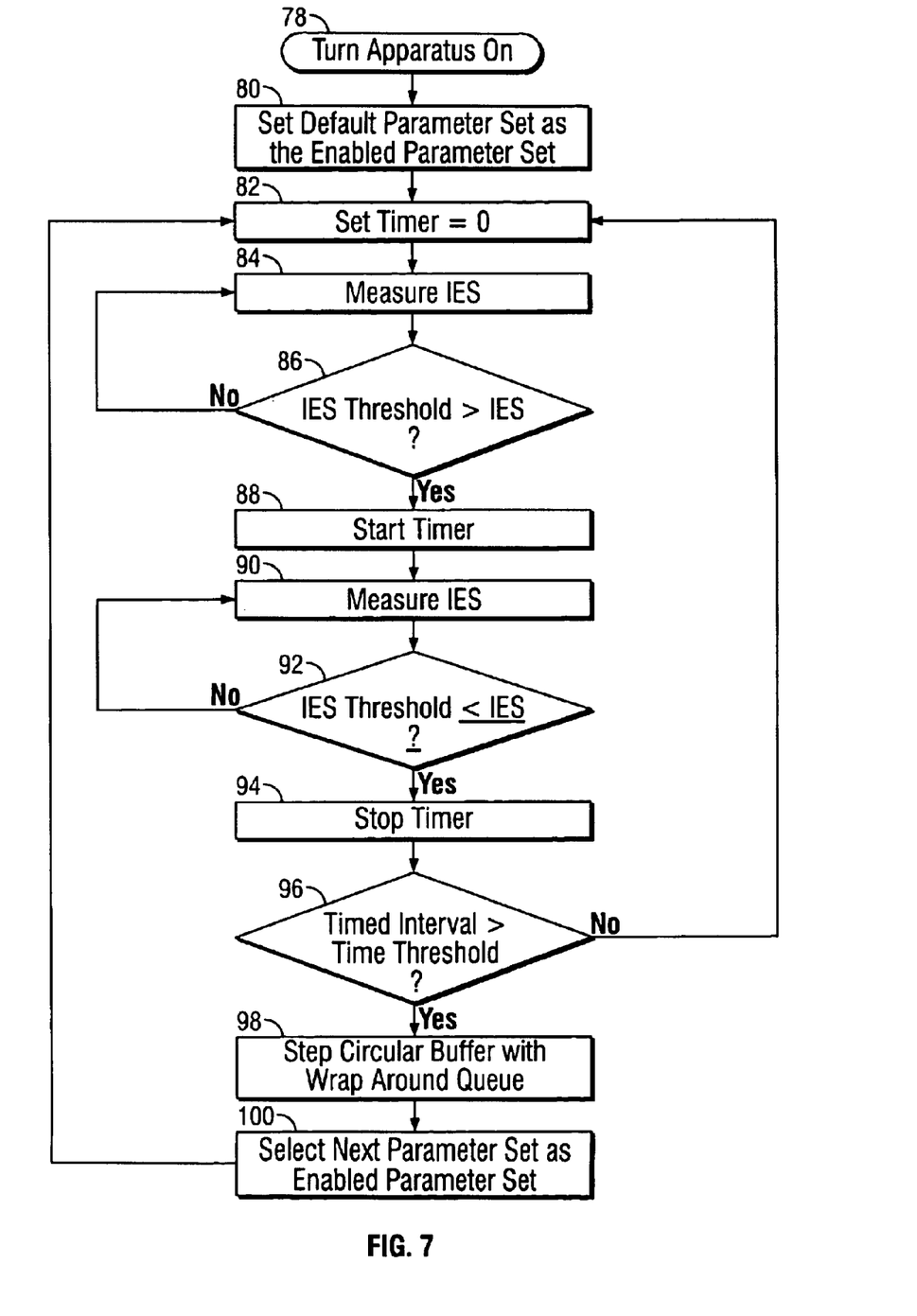
FIG. 7 is a flow diagram of a method of operation of an acoustically activated switch in accordance with the apparatus of FIG. 6.

FIG. 7 is a flow chart of a method of operation of the embodiment of hearing aid 10 depicted in FIG. 6. After the hearing aid 10 is initially turned on at the start at block 78, a default parameter set is preferably installed as the enabled parameter set at block 80. The selector 56 sets a timer 74 to zero at block 82 followed by measuring the IES 34 at block 84. The selector 56 compares the intensity level of the IES 34 against the IES threshold value 60-1 at block 86. If the selector 56 determines the IES 34.is greater than the IES threshold value 60-1, then the selector returns to block 84 to:measure the IES 34. If the selector 56 determines that the IES 34 is less than or equal to IES the threshold value 60-1 then the selector 56 starts the timer 74 at block 88. The selector 56 then proceeds to measuring the IES 34 at block 90, followed by selector 56 comparing the IES 34 against IES threshold value 60-1. If the selector 56 determines that the IES 34 is less than IES threshold value 60-1 at block 92, the IES 34 is again measured at block 90. If the selector 56 determines at block 92 that the IES 34 is greater than IES threshold 60-1, then the selector 56 stops the timer 74 at block 94. After stopping the timer 74, the selector 56 compares the measured time interval against the first time setting 76-1 stored in the third memory 76. If the selector 56 determines that the measured timed interval is less than the threshold time setting 76-1 then the selector 56 resets the timer 74 to zero at block 80. When the selector 56 determines that the measured timed interval is greater than or equal to the threshold time setting 76-1 at block 96 then the selector 56 steps through the circular queue with wrap around memory 58 containing parameter sets 58-1 to 58-n at block 98. The selector 56 selects the next in line parameter set as the enabled parameter set at block 100. Afterwards, control returns back to block 78 by resetting the timer to zero and proceeding as before. Note, there are many other variations that may be used here, for example, instead of waiting for the IES to return from an attenuated state, the system could simply count time while it is attenuated and respond once the time threshold setting 76-1 is exceeded. Similarly, a count down timer could be used instead of a count up timer.

Figure 8:
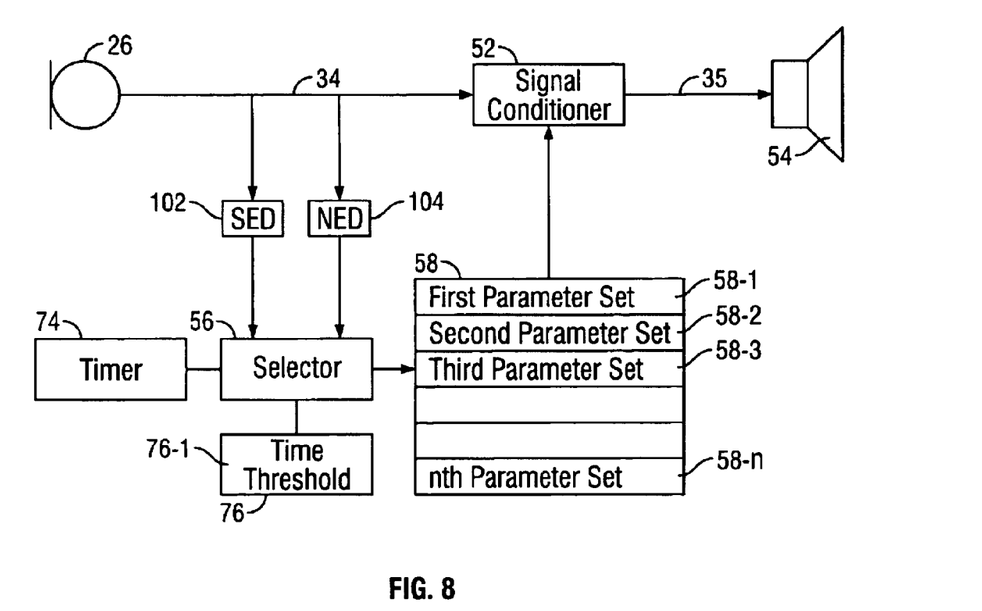
FIG. 8 is a system block diagram of a hearing aid incorporating an acoustically activated switch in accordance with another specific embodiment of the present invention.

FIG. 8 is a system block diagram of yet another specific embodiment of the present invention implemented as a hearing aid. In this embodiment the selector 56 selects an enabled parameter set when the SED signal 38 drops below the NED signal 40 (See discussion above). The microphone 26 converts an input audio signal into an IES 34 and transmits IES 34 to a signal conditioner 52. The signal conditioner 52 is responsive to an enabled parameter set found in a parameter set memory 58 and to the IES 34 for transmitting a CES signal 35 to output transducer 54. Output transducer 54 produces an audio output in response to the CES signal 35. The selector 56 selects one of the plurality of parameter sets in parameter set memory 58 as the enabled parameter set in response to the SED signal 38 and to the NED signal 40. When selector 56 determines that the SED signal 38 is less than the NED signal 40, the selector 56 selects the next-in-line parameter set stored in parameter set memory 58 to be the enabled parameter set.

Figure 9:
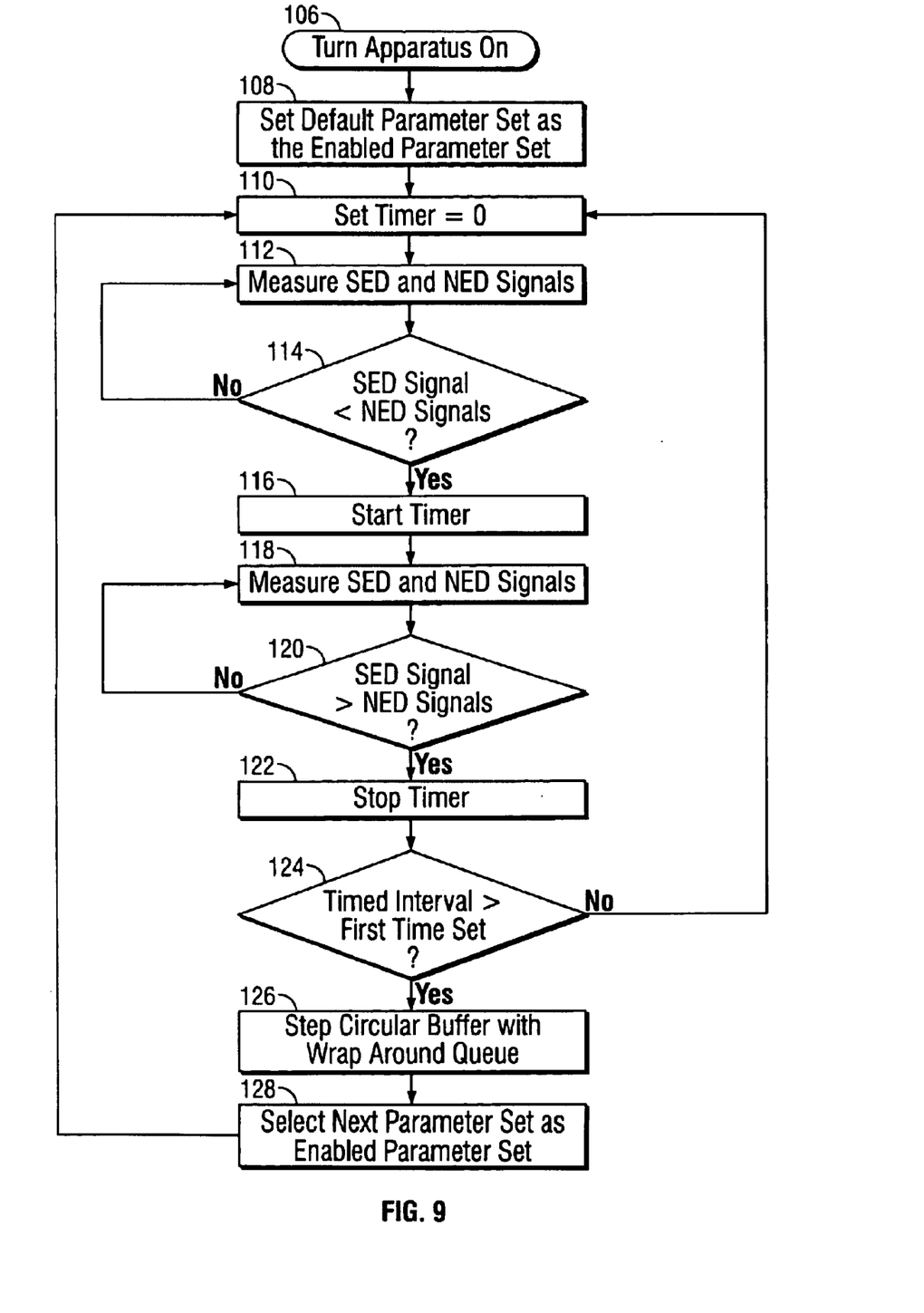
FIG. 9 is a flow diagram of a method of operation of an acoustically activated switch in accordance with the apparatus of FIG. 8.

FIG. 9 is a flow diagram of a method of operation of the hearing aid depicted in FIG. 8. After the hearing aid 10 is initially turned on at the start at block 106, a default parameter set is selected as the enabled parameter set at block 108. The selector 56 sets a timer 74 to zero at block 100 followed by measuring the SED signal 38 and the NED signal 40 at block 108. The selector 56 compares the relative magnitude of the SED signal 38 against the NED signal 40 at block 114. If the NED signal 40 is greater than the SED signal 38, then the selector 56 returns to block 112 to re-measure the SED signal 38 against the NED signal 40. If the SED signal 40 is greater or equal to the NED signal 38, then the selector 56 starts the timer 74 at block 116. The selector 56 then proceeds to measuring the SED signal 38 and the NED signal 40 at block 118. If the SED signal 40 is less than or equal to the NED signal 38 at block 120, then the selector re-measures the SED signal 38 and the NED signal 40 by returning to block 118. If the SED signal 40 is greater than the NED signal 38 at block 120, then the selector 56 stops the timer 74 at block 122. After stopping the timer 74, the selector 56 compares the measured timed interval against the first time setting 76-1 stored in the third memory 76 at block 124. If the measured timed interval is less than the first time setting 76-1 at block 124 then the selector 56 resets the timer 74 to zero by proceeding to block 110. At block 124, when the measured timed interval is found to be greater than or equal to the first time setting 76-1, the selector steps through the circular queue of wrap around memory 58 containing the parameter sets 58-1 to 58-n at block 126. The selector 56 selects the next in line parameter set as the enabled parameter set at block 128. Afterwards, control returns back to block 110 by re-setting the timer to zero and proceeding as before.

Note, there are many other variations that may be used here, for example, instead of waiting for the IES to return from an attenuated state, the system could simply count time while it is attenuated and respond once the time threshold setting 76-1 is exceeded. Similarly, a count down timer could be used instead of a count up timer.

While embodiments and applications of this invention have been shown and described, it would be apparent to those skilled in the art having the benefit of this disclosure that many more modifications than mentioned above are possible without departing from the inventive concepts herein. For example, the switching function could be used to control operating parameters of electronic equipment having an in-the-ear earpiece such as telephones, telecommunications gear, broadcast radio/television, computers, palm computers, and the like. The invention, therefore, is not to be restricted except in the spirit of the appended claims.

What is claimed is:

1. A user operated switch apparatus switchable among a plurality of operational modes by having the user selectively attenuate an input audio signal detected by said apparatus, said apparatus comprising:
   a microphone which converts the selectively attenuated input audio signal to an input electrical signal (IES);
   a first memory which stores a threshold value;
   a second memory which stores at least one parameter set;
   a selector which is responsive to the first memory and to the IES for selecting a first parameter set as an enabled parameter set; and
   a signal conditioner coupled to the input electrical signal, said signal conditioner being responsive to the IES and to an enabled parameter set for producing a conditioned electrical signal (CES).

2. The apparatus of claim 1, wherein said selector is responsive to an intensity level of the IES.

3. The apparatus of claim 1, wherein said selector is responsive to an intensity level of the IES, wherein said selector selects a first parameter set stored in said second memory as the enabled parameter set when the intensity level of the IES is less than the threshold value stored in said first memory.

4. The apparatus of claim 3, further comprising:
   a timer for measuring a timed interval, wherein said timer is responsive to said selector for starting and stopping the timed interval, wherein said selector starts the timer for measuring the timed interval when the intensity level of the IES is less than the threshold value stored in said first memory, wherein said selector stops the timer for measuring the timed interval when the intensity level of the IES is greater than or equal to the threshold value stored in said first memory;
   a third memory for storing the timed interval; and
   a fourth memory for storing a first time setting, wherein said selector is responsive to said third memory and to said fourth memory for selecting the first parameter set stored in said second memory as the enabled parameter set.

5. The apparatus of claim 4, further comprising:
   a fifth memory for storing a second time setting, wherein said selector is responsive to said third memory for storing the timed interval and responsive to the fifth memory for storing a second time setting for selecting a second parameter set stored in said second memory as the enabled parameter set.

6. The apparatus of claim 5, further comprising:
   a sixth memory for storing a number proportional to the long term average of the absolute value of the intensity of the IES, wherein said selector is responsive to said sixth memory for changing said first memory storing the threshold value, thereby changing the threshold value in response to the long term average of the absolute value of the intensity of the IES.

7. The apparatus of claim 1, further comprising:
   an external adjuster which adjusts the data stored in said first memory to change the threshold value.

8. The apparatus of claim 1, further comprising:
   an external changer which changes the data stored in said second memory to change the parameter set.

9. The apparatus of claim 5, further comprising:
   an external modifier which modifies the data stored in said fourth and fifth memory to change the first and second time settings, respectively.

10. The apparatus of claim 1 further comprising:
    an output transducer coupled to the CES for producing an audio output.

11. The apparatus of claim 10 wherein said apparatus is a hearing aid.

12. A user operated switch apparatus switchable among a plurality of operational modes by having the user selectively attenuate an input audio signal detected by said apparatus, said apparatus comprising:
    a microphone which converts the selectively attenuated input audio signal to an input electrical signal (IES);
    a first circuit which expresses a threshold value;
    a second circuit which expresses at least one parameter set;
    a selector which is responsive to said first circuit and to the IES for selecting a first parameter set expressed by said second circuit as an enabled parameter set; and
    a signal conditioner coupled to the IES, said signal conditioner being responsive to the IES and to the enabled parameter set for producing a conditioned electrical signal (CES).

13. The apparatus of claim 12, wherein:
    said selector is responsive to an intensity level of the IES.

14. The apparatus of claim 12, wherein said selector is responsive to an intensity level of the IES, wherein said selector selects a first parameter set expressed by said second circuit as the enabled parameter set when the intensity level of the IES is less than the threshold value expressed by said first circuit.

15. The apparatus of claim 14, further comprising:
    a timer for measuring a timed interval, wherein said timer is responsive to said selector for starting and stopping the timed interval, wherein selector starts the timer for measuring the timed interval when the intensity level of the IES is less than the threshold value expressed by said first circuit, wherein said selector stops the timer for measuring the timed interval when the intensity level of the IES is greater than or equal to the threshold value expressed by said first circuit;

a third circuit for expressing the timed interval; and a fourth circuit for expressing a first time setting, wherein said selector is responsive to said third circuit and to said fourth circuit for selecting the first parameter set expressed by said second circuit as the enabled parameter set.

16. The apparatus of claim 15, further comprising:

a fifth circuit for expressing a second time setting, wherein said selector is responsive to said third circuit for expressing the timed interval and responsive to the fifth circuit for expressing a second time setting for selecting a second parameter set expressed by said second memory as the enabled parameter set.

17. The apparatus of claim 16, further comprising:

a sixth circuit for expressing a number proportional to the long term average of the absolute value of the intensity of the IES, wherein said selector is responsive to said sixth circuit for changing said first circuit for expressing the threshold value, thereby changing the threshold value in response to the long term average of the absolute value of the intensity of the IES.

18. The apparatus of claim 12, further comprising:

an external adjuster which adjusts said first circuit which expresses the threshold value.

19. The apparatus of claim 13, further comprising:

an external changer which changes the settings of said second circuit which expresses the at least one parameter set.

20. The apparatus of claim 16, further comprising:

an external modifier which modifies the settings of said fourth and fifth circuits which express the first and second time settings, respectively.

21. The apparatus of claim 12 further comprising:

an output transducer coupled to the conditioned electrical signal for producing an audio output.

22. The apparatus of claim 21 wherein said apparatus is a hearing aid.

23. A user operated switch apparatus switchable among a plurality of operational modes by having the user selectively attenuate an input audio signal detected by said apparatus, said apparatus comprising:

a microphone which converts the selectively attenuated input audio signal to an input electrical signal (IES);

a first circuit which expresses a default parameter set;

a first memory which stores a threshold value;

a second memory which stores at least one parameter set;

a selector which is responsive to said first memory and to the IES for selecting a first parameter set stored in said second memory as the enabled parameter set; and a signal conditioner coupled to the IES, said signal conditioner responsive to the IES and to an enabled parameter set for producing a conditioned electrical signal (CES), wherein a first operational state is activated when said apparatus is initially turned on by using said first circuit which expresses the default parameter set as the enabled parameter set, and wherein a second operational state is activated when said selector selects a first parameter set from said second memory as an enabled parameter set.

24. The apparatus of claim 23, wherein said selector is responsive to an intensity level of the IES.

25. The apparatus of claim 23, wherein said selector is responsive to an intensity level of the IES, wherein said selector selects a first parameter set stored in said second memory as the enabled parameter set when the intensity level of the IES is less than the threshold value stored in said first memory.

26. The apparatus of claim 25, further comprising:

a timer for measuring a timed interval, wherein said timer is responsive to said selector for starting and stopping the timed interval, wherein said selector starts the timer for measuring the timed interval when the intensity level of the IES is less than the threshold value stored in said first memory, wherein said selector stops the timer for measuring the timed interval when the intensity level of the IES is greater than or equal to the threshold value stored in said first memory;

a third memory for storing the timed interval; and a fourth memory for storing a first time setting, wherein said selector is responsive to said third memory and to said fourth memory for selecting the first parameter set stored in said second memory as the enabled parameter set.

27. The apparatus of claim 26, further comprising:

a fifth memory for storing a second time setting, wherein said selector is responsive to said third memory for storing the timed interval and responsive to the fifth memory for storing a second time setting for selecting a second parameter set stored in said second memory as the enabled parameter set.

28. The apparatus of claim 27, further comprising:

a sixth circuit for expressing a number proportional to the long term average of the absolute value of the intensity of the IES, wherein said selector is responsive to said sixth circuit for changing said first circuit for expressing the threshold value, thereby changing the threshold value in response to the long term average of the absolute value of the intensity of the IES.

29. The apparatus of claim 23, further comprising:

an external adjuster which adjusts the data stored in said first memory to change the threshold value.

30. The apparatus of claim 23, further comprising:

an external changer which changes the data stored in said second memory to change the parameter set.

31. The apparatus of claim 24, further comprising:

an external modifier which modifies the data stored in said fourth and fifth memory to change the first and second time settings, respectively.

32. The apparatus of claim 23, further comprising:

an output transducer coupled to said CES for producing an audio output.

33. The apparatus of claim 32 wherein said apparatus is a hearing aid.

34. A switch apparatus switchable among a plurality of operational modes by attenuating an input audio signal detected by said apparatus, said apparatus comprising:

a microphone which converts the input audio signal to an input electrical signal (IES);

a signal envelope detector (SED) coupled to the IES, said SED having a first time constant, wherein said SED produces a SED output in response to the IES;

a noise envelope detector (NED) coupled to the IES, said NED having a second time constant that is greater than the first time constant, said NED produces a NED output in response to the IES;

a first memory which stores at least one parameter set;

a selector which is responsive to the SED output and to the NED output for selecting a first parameter set as an enabled parameter set; and a signal conditioner coupled to the IES, said signal conditioner being responsive to the IES and to an enabled parameter set for producing a conditioned electrical signal (CES).

35. The apparatus of claim 34, wherein said selector is responsive to a relative difference between the SED output and the NED output.

36. The apparatus of claim 34, wherein:

said selector is responsive to an intensity level of the SED output and the intensity level of the NED output, wherein said selector selects the first parameter set stored in the first memory as the enabled parameter set when the intensity level of the SED output is less than the intensity of the NED output.

37. The apparatus of claim 36, further comprising:

a timer for measuring a timed interval, wherein said timer is responsive to said selector for starting and stopping the timed interval, wherein said selector starts the timer for measuring the timed interval when SED output is less than the NED output, wherein said selector stops the timer for measuring the timed interval when the SED output is greater than or equal to NED output;

a second memory for storing the timed interval; and a third memory for storing a first time setting, wherein said selector is responsive to said second memory and to said third memory for selecting the first parameter set stored in said first memory as the enabled parameter set.

38. The apparatus of claim 37, further comprising:

a fourth memory for storing a second time setting, wherein said selector is responsive to said second memory which stores the timed interval and responsive to said fourth memory which stores the second time setting for selecting a second parameter set stored in said first memory as the enabled parameter set.

39. The apparatus of claim 34, further comprising:

an external adjuster which adjusts the SED time constant.

40. The apparatus of claim 34, further comprising:

an external adjuster which adjusts the NED time constant.

41. The apparatus of claim 34, further comprising:

an external changer which changes the component values of the plurality of parameter sets stored in said first memory.

42. The apparatus of claim 38, further comprising:

an external modifier which modifies the first and second time settings stored in said third and fourth memory, respectively.

43. The apparatus of claim 34, further comprising:

an output transducer coupled to the CES for producing an audio output.

44. The apparatus of claim 43 wherein said apparatus is a hearing aid.

45. A method of operating a switch switchable among a plurality of operational modes by having a user selectively attenuate an input audio signal detected by said apparatus, said method comprising:

converting the selectively attenuated input audio signal to an input electrical signal (IES) with a microphone;

storing a threshold value in a first memory;

storing at least one parameter set in a second memory;

selecting a first parameter set as an enabled parameter set by a selector which is responsive to the first memory and to the IES; and producing a conditioned electrical signal (CES) by a signal conditioner coupled to the IES, wherein the signal conditioner being responsive to the IES and to an enabled parameter set.

46. The method of claim 45, wherein:

responding to an intensity level of the IES by the selector.

47. The method of claim 46, wherein:

selecting a first parameter set stored in the second memory as the enabled parameter set when the intensity level of the IES is less than the threshold value stored in the first memory.

48. The method of claim 47, further comprising:

measuring a timed interval by a timer, wherein the timer is responsive to the selector for starting and stopping the timed interval, wherein the selector starts the timer for measuring the timed interval when the intensity level of the IES is less than the threshold value stored in the first memory, wherein the selector stops the timer for measuring the timed interval when the intensity level of the IES is greater than or equal to the threshold value stored in the first memory;

storing the timed interval in a third memory; and storing a first time setting in a fourth memory, wherein the selector is responsive to the third memory and to the fourth memory for selecting the first parameter set stored in the second memory as the enabled parameter set.

49. The method of claim 48, further comprising:

storing a second time setting in a fifth memory, wherein the selector is responsive to the third memory for storing the timed interval and responsive to the fifth memory for storing a second time setting for selecting a second parameter set stored in said second memory as the enabled parameter set.

50. The method of claim 49, further comprising:

storing a number in a sixth memory, the number proportional to the long term average of the absolute value of the intensity of the IES, wherein the selector is responsive to the sixth memory for changing the first memory storing the threshold value, thereby changing the threshold value in response to the long term average of the absolute value of the intensity of the IES.

51. The method of claim 45, further comprising:

adjusting the first memory to change the threshold value by an external adjuster.

52. The method of claim 45, further comprising:

changing the data stored in the second memory to alter the parameter set by an external changer.

53. The method of claim 49, further comprising:

modifying the data stored in the fourth and fifth memory to alter the first and second time settings, respectively by an external modifier.

54. The method of claim 45, further comprising:

producing an audio output by an output transducer coupled to the CES for producing an audio output.

55. The method of claim 54, further comprising using the apparatus as a hearing aid.

56. A method of operating a switch apparatus switchable among a plurality of operational modes by attenuating an input audio signal detected by said apparatus, said apparatus comprising:

converting the input audio signal to an input electrical signal (IES) with a microphone;

using a signal envelope detector (SED) coupled to the IES, the SED having a first time constant to produces a SED output in response to the IES;

using a noise envelope detector (NED) coupled to the IES, said NED having a second time constant that is greater than the first time constant to produce a NED output in response to the IES;

storing at least one parameter set in a first memory;

selecting a first parameter set as an enabled parameter set with a selector which is responsive to the SED output and to the NED output; and producing a conditioned electrical signal (CES) with a signal conditioner coupled to the IES, said signal conditioner being responsive to the IES and to an enabled parameter set.

57. The method of claim 56, wherein the selector responds to a relative difference between the SED output and the NED output with the selector.

58. The method of claim 57, wherein:

responding to an intensity level of the SED output and the intensity level of the NED output with the selector;

determining when the intensity level of the SED output is less than the intensity of the NED output with the selector; and selecting the first parameter set stored in the first memory as the enabled parameter set with the selector.

59. The method of claim 58, further comprising:

using a timer for measuring a timed interval, wherein the timer is responsive to the selector for starting and stopping the timed interval with the selector;

starting the timer with the selector for measuring the timed interval when SED output is less than the NED output;

stopping the timer with the selector for measuring the timed interval when the SED output is greater than or equal to NED output;

storing the timed interval in a second memory with the selector; and storing a first time setting in a third memory with the selector, wherein said selector is responsive to said second memory and to said third memory; and selecting with the selector the first parameter set stored in the first memory as the enabled parameter set.

60. The method of claim 59, further comprising:

storing a second time setting in a fourth memory; and selecting with the selector a second parameter set stored in said first memory as the enabled parameter set, wherein the selector is responsive to said second memory which stores the timed interval and responsive to said fourth memory which stores the second time setting.

61. The method of claim 56, further comprising:

adjusting the first time constant of the SED with an external adjuster.

62. The method of claim 56, further comprising:

adjusting the second time constant of the NED with an external adjuster.

63. The method of claim 56, further comprising:

changing the component values of the plurality of parameter sets stored in the first memory with an external changer.

64. The method of claim 59, further comprising:

modifying the first and second time settings stored in the third and fourth memory, respectively.

65. The method of claim 56, further comprising:

producing an audio output with an output transducer coupled to the CES.

66. The apparatus of claim 65, wherein said apparatus is a hearing aid.

67. A program storage device readable by a machine, tangibly embodying a program of instructions executable by the machine to perform a method of operating a switch switchable among a plurality of operational modes by having a user selectively attenuate an input audio signal detected by said apparatus, the method comprising:

converting the selectively attenuated input audio signal to an input electrical signal (IES) with a microphone;

storing a threshold value in a first memory;

storing at least one parameter set in a second memory;

selecting a first parameter set as an enabled parameter set by a selector which is responsive to the first memory and to the IES for; and producing a conditioned electrical signal (CES) by a signal conditioner coupled to the IES, wherein said signal conditioner being responsive to the IES and to an enabled parameter set for.

68. The device in accordance with claim 67 wherein said method further comprises:

responding to an intensity level of the IES by the selector.

69. The device in accordance with claim 67 wherein said method further comprises:

selecting a first parameter set stored in said second memory as the enabled parameter set when the intensity level is less than the threshold value stored in the first memory.

70. The device in accordance with claim 69 wherein said method further comprises:

measuring a timed interval by a timer, wherein the timer is responsive to the selector for starting and stopping the timed interval, wherein the selector starts the timer for measuring the timed interval when the intensity level of the IES is less than the threshold value stored in the first memory, wherein the selector stops the timer for measuring the timed interval when the intensity level of the IES is greater than or equal to the threshold value stored in the first memory;

storing the timed interval in a third memory; and storing a first time setting in a fourth memory, wherein the selector is responsive to the third memory and to the fourth memory for selecting the first parameter set stored in the second memory as the enabled parameter set.

71. The device in accordance with claim 70 wherein said method further comprises:

storing a second time setting in a fifth memory, wherein the selector is responsive to the third memory for storing the timed interval and responsive to the fifth memory for storing a second time setting for selecting a second parameter set stored in the second memory as the enabled parameter set.

72. The device in accordance with claim 71 wherein said method further comprises:

storing a number a sixth memory, said number proportional to the long term average of the absolute value of the intensity of the IES, wherein said selector is responsive to said sixth memory for changing said first memory storing the threshold value, thereby changing the threshold value in response to the long term average of the absolute value of the intensity of the IES.

73. The device in accordance with claim 67 wherein said method further comprises:

adjusting the data stored in the first memory to alter the threshold value by an external adjuster.

74. The device in accordance with claim 67 wherein said method further comprises:

changing the data stored in the second memory to alter the parameter set by an external changer.

75. The device in accordance with claim 71 wherein said method further comprises:

modifying the data stored in the fourth and fifth memory to alter the first and second time settings, respectively by an external modifier.

76. The device in accordance with claim 67 wherein said method further comprises:

producing an audio output by an output transducer coupled to the CES for producing an audio output.

77. The device in accordance with claim 76 wherein said method further comprises using the apparatus as a hearing aid.

78. A program storage device readable by a machine, tangibly embodying a program of instructions executable by the machine to perform a method of operating a switch apparatus switchable among a plurality of operational modes by attenuating an input audio signal detected by an apparatus, the method comprising:

converting the input audio signal to an input electrical signal (IES) with a microphone;

using a signal envelope detector (SED) coupled to the IES, the SED having a first time constant to produces a SED output in response to the IES;

using a noise envelope detector (NED) coupled to the IES, said NED having a second time constant that is greater than the first time constant to produce a NED output in response to the IES;

storing at least one parameter set in a first memory;

selecting a first parameter set as an enabled parameter set with a selector which is responsive to the SED output and to the NED output; and producing a conditioned electrical signal (CES) with a signal conditioner coupled to the IES, the signal conditioner being responsive to the IES and to an enabled parameter set.

79. The device in accordance with claim 78 wherein said method further comprises:

responding to a relative difference between the SED output and the NED output with said selector.

80. The device in accordance with claim 78 wherein said method further comprises:

responding to an intensity level of the SED output and the intensity level of the NED output said with the selector;

determining when the intensity level of the SED output is less than the intensity of the NED output with the selector; and selecting the first parameter set stored in said first memory as the enabled parameter set with the selector.

81. The device in accordance with claim 80 wherein said method further comprises:

using a timer for measuring a timed interval, wherein the timer is responsive to the selector for starting and stopping the timed interval with the selector;

starting the timer for measuring the timed interval when SED output is less than the NED output with the selector; and stopping the timer for measuring the timed interval when the SED output is greater than or equal to NED output with the selector;

storing the timed interval in a second memory with the selector; and storing a first time setting in a third memory with the selector, wherein the selector is responsive to the second memory and to the third memory;

selecting the first parameter set stored in the first memory as the enabled parameter set.

82. The device in accordance with claim 81 wherein said method further comprises:

storing a second time setting in a fourth memory; and selecting a second parameter set stored in the first memory as the enabled parameter set, wherein the selector is responsive to the second memory which stores the timed interval and responsive to the fourth memory which stores the second time setting.

83. The device in accordance with claim 78 wherein said method further comprises:

adjusting the SED time constant with an external adjuster.

84. The device in accordance with claim 78 wherein said method further comprises:

adjusting the NED time constant with an external adjuster.

85. The device in accordance with claim 78 wherein said method further comprises:

changing the component values of the plurality of parameter sets stored in the first memory with an external changer.

86. The device in accordance with claim 78 wherein said method further comprises:

modifying the first and second time settings stored in the third and fourth memory, respectively.

87. The device in accordance with claim 78 wherein said method further comprises:

producing an audio output with an output transducer coupled to the CES.

88. The device in accordance with claim 87 wherein said method further comprises:

using the apparatus as a hearing aid.

* * * * *

UNITED STATES PATENT AND TRADEMARK OFFICE
CERTIFICATE OF CORRECTION

PATENT NO. : 6,748,089 B1
DATED : June 8, 2004
INVENTOR(S) : Harris et al.

It is certified that error appears in the above-identified patent and that said Letters Patent is hereby corrected as shown below:

Column 5,
Line 65, replace "IES34.is" with -- IES34 is --
Line 67, between "to" and "measure" delete ":"

Signed and Sealed this

Nineteenth Day of July, 2005

JON W. DUDAS
*Director of the United States Patent and Trademark Office*